United States Patent [19]

Ebihara et al.

[11] 4,101,790

[45] Jul. 18, 1978

[54] SHIFT REGISTER WITH REDUCED NUMBER OF COMPONENTS

[75] Inventors: Heichachiro Ebihara, Tokorozawa; Takashi Yamada, Sayama, both of Japan

[73] Assignee: Citizen Watch Company Limited, Tokyo, Japan

[21] Appl. No.: 776,018

[22] Filed: Mar. 9, 1977

[30] Foreign Application Priority Data

Mar. 10, 1976 [JP] Japan .................................. 51-25042

[51] Int. Cl.$^2$ ...................... G11C 19/28; H03K 17/60
[52] U.S. Cl. .............................. 307/221 C; 307/224 C; 307/269; 307/279
[58] Field of Search ........... 307/220 R, 220 C, 221 R, 307/221 C, 223 C, 224 C, 225 C, 269, 279

[56] References Cited

U.S. PATENT DOCUMENTS

| 3,578,984 | 5/1971 | Ryley | 307/221 C |
| 3,766,408 | 10/1973 | Suzuki et al. | 307/223 C |
| 3,930,169 | 12/1975 | Kuhn, Jr. | 307/224 C X |
| 4,002,926 | 1/1977 | Moyer | 307/279 X |

FOREIGN PATENT DOCUMENTS

| 2,267,666 | 11/1975 | France | 307/221 C |
| 2,309,080 | 9/1973 | Fed. Rep. of Germany | 307/225 C |
| 2,237,579 | 2/1974 | Fed. Rep. of Germany | 307/279 |
| 2,541,255 | 3/1976 | Fed. Rep. of Germany | 307/279 |

OTHER PUBLICATIONS

Suzuki et al., "Clocked CMOS Calculator Circuitry"; IEEE Journ. of Solid-State Circuits; vol. SC-8, No. 6, pp. 462-469; 12/1973.

Primary Examiner—Larry N. Anagnos
Attorney, Agent, or Firm—Frank J. Jordan

[57] ABSTRACT

A shift register which comprises a master section including first and second P-channel MOS transistors and first and second N-channel MOS transistors, and a slave section including third and fourth P-channel MOS transistors and third and fourth N-channel MOS transistors. The junction between the drain electrode of the first P-channel MOS transistor and the source electrode of the second P-channel MOS transistor and the junction between the source electrode of the first N-channel MOS transistor and the drain electrode of the second N-channel MOS transistor are connected to an output of the master section of the preceding stage through a P-channel MOS transistor and an N-channel MOS transistor, respectively. The junction between the drain electrode of the third P-channel MOS transistor and the source electrode of the fourth P-channel MOS transistor and the junction between the source electrode of the third N-channel MOS transistor and the drain electrode of the fourth N-channel MOS transistor are connected to an output of the slave section of the preceding stage through a P-channel MOS transistor and an N-channel MOS transistor, respectively.

5 Claims, 9 Drawing Figures

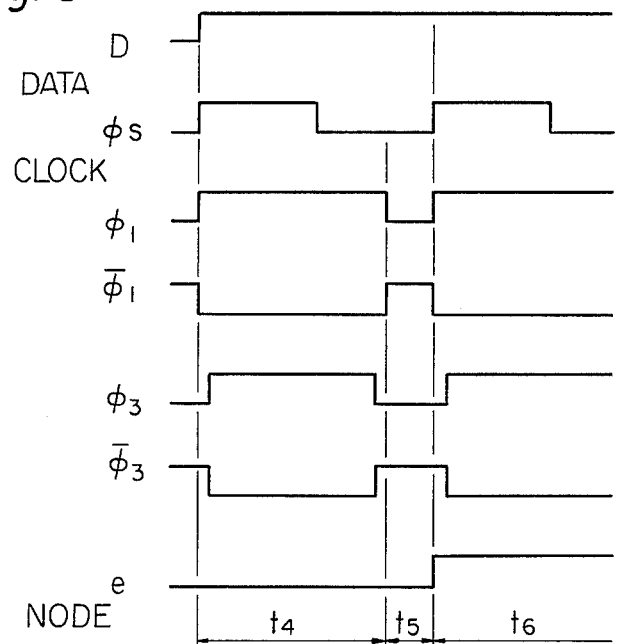
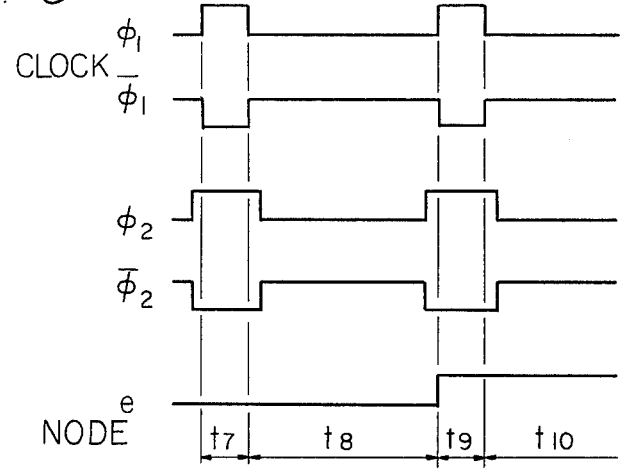

SHIFT REGISTER WITH REDUCED NUMBER OF COMPONENTS

BACKGROUND OF THE INVENTION

This invention relates to a shift register and more particularly to a shift register with a greatly reduced number of components but which is capable of functioning without any reduction in performance.

It is a primary object of the present invention to provide a shift register constituted by a minimum number of components.

It is another object of the present invention to provide a shift register which can be incorporated in an extremely small size integrated circuit chip of various electronic devices.

These and other objects and features of the present invention will become more apparent from the following description when taken in conjunction with the accompanying drawings.

BRIEF DESCRIPTION OF THE DRAWINGS

FIG. 8 shows the clock signal waveforms for the driving clock signals used in the semi-static shift register of FIG. 3; and FIG. 9 is a waveform diagram for the circuit of FIG. 4.

DESCRIPTION OF THE PREFERRED EMBODIMENTS

Figure 1:
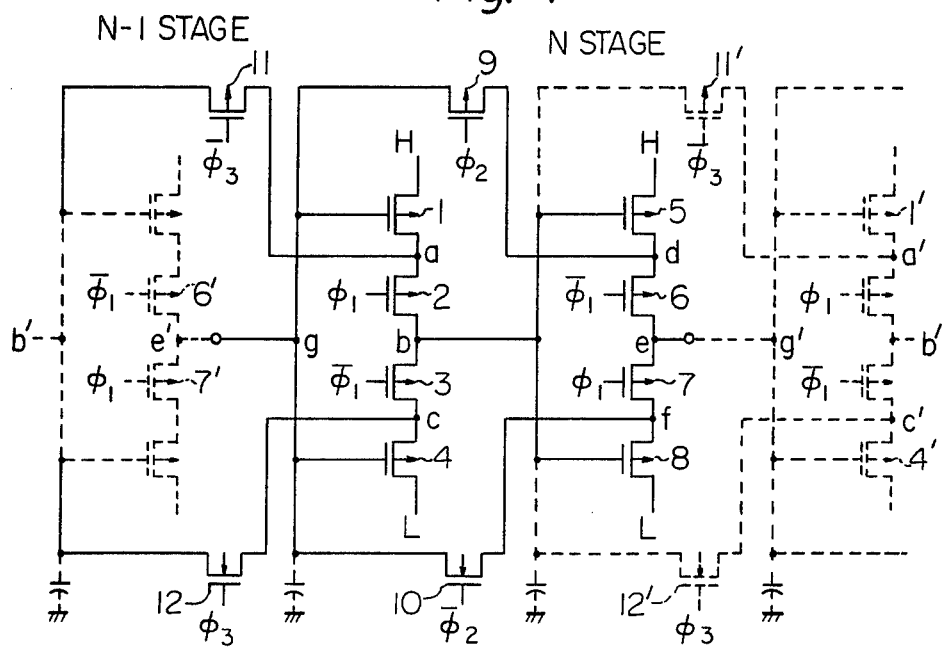
FIG. 1 shows the construction of a static shift register in accordance with the invention.

For a more complete description of the invention, reference is had to the accompanying drawings in which FIG. 1 shows a preferred embodiment of a static shift register according to the present invention. A master section is formed by a number of P-channel MOS and N-channel MOS transistors (hereinafter, abbreviated as P-MOST and N-MOST, respectively) connected at a number of points $a$, $b$ and $c$. More specifically, the drain electrode of P-MOST 1 having a source electrode tied to the high potential side (hereinafter referred to as H) of a power supply is connected to the source electrode of P-MOST 2 at a node $a$, the drain electrode of P-MOST 2 is connected to the drain electrode of N-MOST 3 at a node $b$, the source electrode of N-MOST 3 is connected to the drain electrode of N-MOST 4 at a node $c$, and the source electrode of N-MOST 4 is connected to the low potential side (hereinafter referred to as L) of the power source. This forms the previously mentioned master section. For a slave section the source electrode of P-MOST 5 is tied to the H side of the power source while its drain electrode is connected to the source electrode of P-MOST 6 at a node $d$, the drain electrode of P-MOST 6 is connected to the drain electrode of N-MOST 7 at a node $e$, the source electrode of N-MOST 7 is connected to the drain electrode of N-MOST 8 at a node $f$, and the source electrode of N-MOST 8 is connected to the L side of the power source. The master section and slave section may be combined to form a 1-bit stage by tying the gate electrodes of P-MOST 1 and N-MOST 4 to a common data terminal $g$, applying clock signals $\phi 1$ and $\overline{\phi 1}$ to the respective gate electrodes of P-MOST 2 and N-MOST 3, commonly tying the gate electrodes of P-MOST 5 and N-MOST 8 to node $b$, and applying a clock signal $\overline{\phi 1}$ to the gate electrode of P-MOST 6 and a clock signal $\phi 1$ to the gate electrode of N-MOST 7. This 1-bit stage is then connected to a plurality of similarly constructed cascades to construct the shift register.

With the exception of an initial stage, the node $g$ of an Nth stage is connected to the node $e'$ of an (N-1)th stage, the node $d$ of the Nth stage slave section is connected through P-MOST 9 to the node $e'$ of the (N-1)th stage slave section, the node $f$ of the Nth stage slave section is similarly connected through N-MOST 10 to the node $e'$ of the (N-1)th stage slave section, the node $a$ of the Nth stage master section is connected through P-MOST 11 to the node $b'$ of the (N-1)th stage master section, the node $c$ of the Nth stage master section is similarly connected through N-MOST 12 to the node $b'$ of the (N-1)th stage master section, a clock signal $\phi 2$ is applied to the gate electrode of P-MOST 9, a clock signal $\overline{\phi 2}$ is applied to the gate electrode of N-MOST 10, a clock signal $\phi 3$ is applied to the gate electrode of P-MOST 11, and a clock signal $\overline{\phi 3}$ is applied to the gate electrode of N-MOST 12, whereby an output signal is obtained at node $e$.

Figure 2:
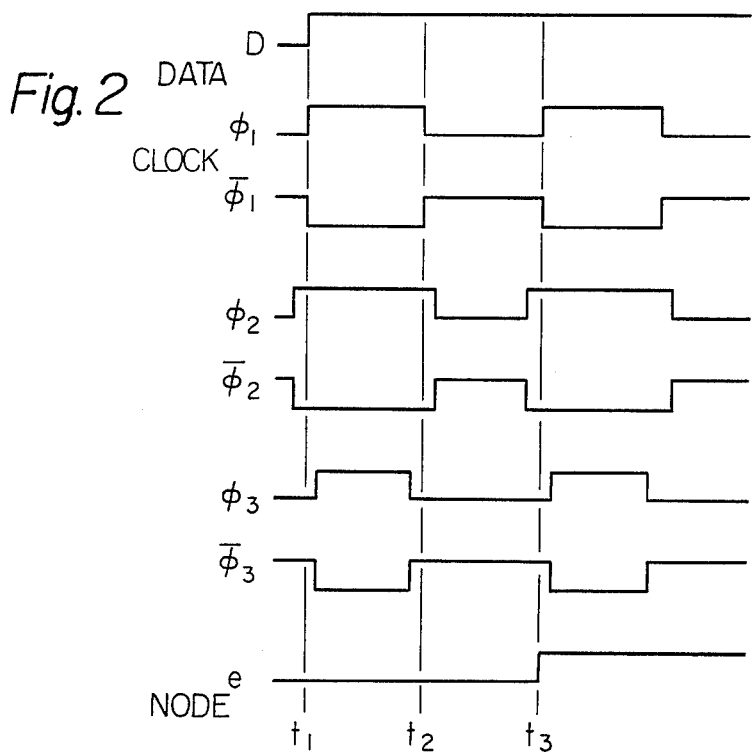
FIG. 2 is one example of driving clock pulses used in the invention.

FIG. 2 shows clock signal waveforms for one particular embodiment of the invention. For the waveforms as shown, the circuit depicted in FIG. 1 operates as follows. At time $t1$ clock signal $\phi 1$ attains an H logic level. The data is transferred to data terminal $g$. This enables N-MOST 4 since its drain and source electrodes are now shortcircuited and disenables P-MOST 1, P-MOST 2 and N-MOST 3 since conduction between their drain and source electrodes is interrupted. Consequently, an L logic level is established at node $c$, prior to this time $t1$ at which the level at node $g$ is unaffected, P-MOST 9 and N-MOST 10 are disenabled so that transfer of the electric potentials at nodes $d$ and $f$ of the slave section to the node $g$ of the master section is interrupted.

After clock signal $\phi 1$ attains an H logic level and the level of node $c$ is established, clock signal $\overline{\phi 3}$ attains an H logic level, N-MOST 12 is enabled and the L logic level at node $c$ is transferred to node $b'$. At this time clock signal $\phi 3$ attains an L logic level which enables P-MOST11. Clock signal $\phi 3$ attains an L logic level immediately before a time $t2$ whereby P-MOST 11 and 12 are disenabled. At time $t2$ when clock signal $\phi 1$ changes from an H to an L logic level, P-MOST 6' and N-MOST 7' are disenabled and node $e'$ is dynamically held at an H logic level. Accordingly, N-MOST 4 is continuously in an enabled state, P-MOST 1 is continuously in a disenabled state, and P-MOST 2 and N-MOST 3 are enabled, whereby node $b'$ attains a static L logic level. Due to the L logic level at node $b$, P-MOST 5 is enabled and N-MOST 8 disenabled. After the states of P-MOST 5 and N-MOST 8 have been established, clock signal $\phi 2$ changes from an H to an L logic level whereupon P-MOST 9 and N-MOST 10 are enabled. At this time node $e'$ is connected to the high potential side of the power source through P-MOST 5 and P-

MOST 9 whereby node e' changes from a dynamic to a static H logic level.

At a time t3 when clock signal φ1 is about to change from an L to an H logic level, clock signal φ2 has already attained an H logic level immediately before such time so that P-MOST 9 and N-MOST 10 are both disenabled. When clock signal φ1 attains an H level, P-MOSTs 6 and 6' and N-MOSTs 7 and 7' are enabled, P-MOST 2 and N-MOST 3 are both disenabled, and node b attains a dynamic L logic level. Due to the L level at node b, P-MOST 5 is continuously in an enabled state and the potential at the H side of the power source is accordingly transferred to node e through P-MOSTs 5 and 6, thereby bringing node e to a static H logic level. This H level at node e enables N-MOST 4' of the next stage whereupon N-MOST 12' is enabled and the potential at the L side of the power source is transferred to node b so that the node b changes from a dynamic to a static L logic level. Similarly, if node e' is at an H logic level, the L side of the power source is connected to node b' of the preceding stage through N-MOST 4 and N-MOST 12 thereby establishing a static L level. Thereafter data is transmitted in the same manner.

Figure 5:
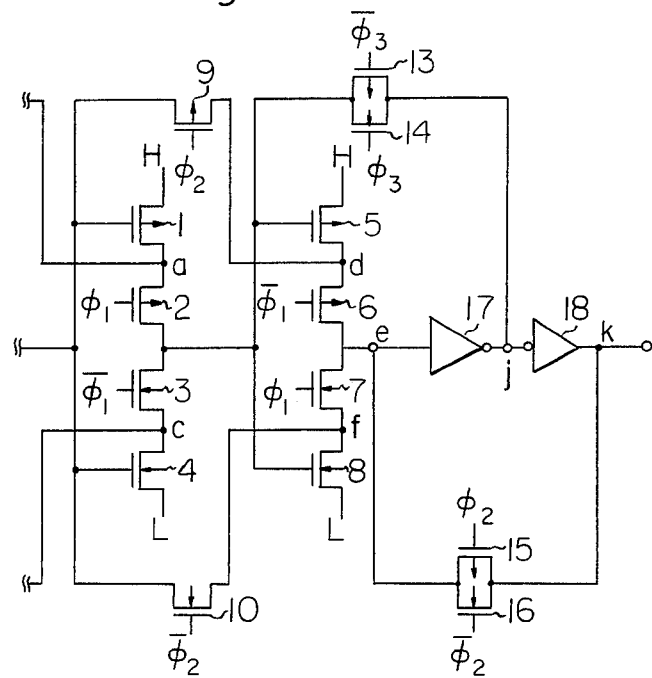
FIG. 5 shows the final stage circuitry for the static shift register of FIG. 1.

The final stage of the static shift register is shown in FIG. 5. Here, node e is connected to the input terminal of a complementary MOST inverter 17 the output terminal j of which is connected to the source electrode of a P-MOST 13 and an N-MOST 14. The respective drain electrodes of MOSTs 13 and 14 are connected to the node b of the final stage, node j is connected to the input terminal of complementary MOST inverter 18 the output terminal k of which is connected commonly to the source electrodes of P-MOST 15 and N-MOST 16, the respective drain electrodes of MOSTs 15 and 16 are connected to node e of the final stage, a clock signal φ3 is supplied to the gate input terminal of P-MOST 13, a clock signal φ3 supplied to the gate input terminal of N-MOST 14, a clock signal φ2 is supplied to the gate input terminal of P-MOST 15, and a clock signal φ2 is supplied to the gate input terminal of N-MOST 16. Upon applying these clock signals to the mentioned terminals, the static H logic level of the final stage node e lowers node j to an L logic level across inverter 17. This L level is in turn passed by inverter 18 and brings node k to an H level which is a static level as is the level at node e.

At the time that clock signal φ1 changes from an H to an L level, MOSTs 13 and 14 are disenabled and node e attains a dynamic H level since P-MOST 6 and N-MOST 7 are disenabled after the transfer of the electrical potential at node j is interrupted. MOSTs 15 and 16 are thus enabled, the potential at node k is transferred and node e is accordingly brought to a static H level.

When clock signal φ1 is about to change from an L to an H level, P-MOST 6 and N-MOST 7 are enabled after MOSTs 15 and 16 are disenabled. In this manner a stable final stage output signal O can be obtained at node k and a signal Q similarly obtained at node j.

Figure 3:
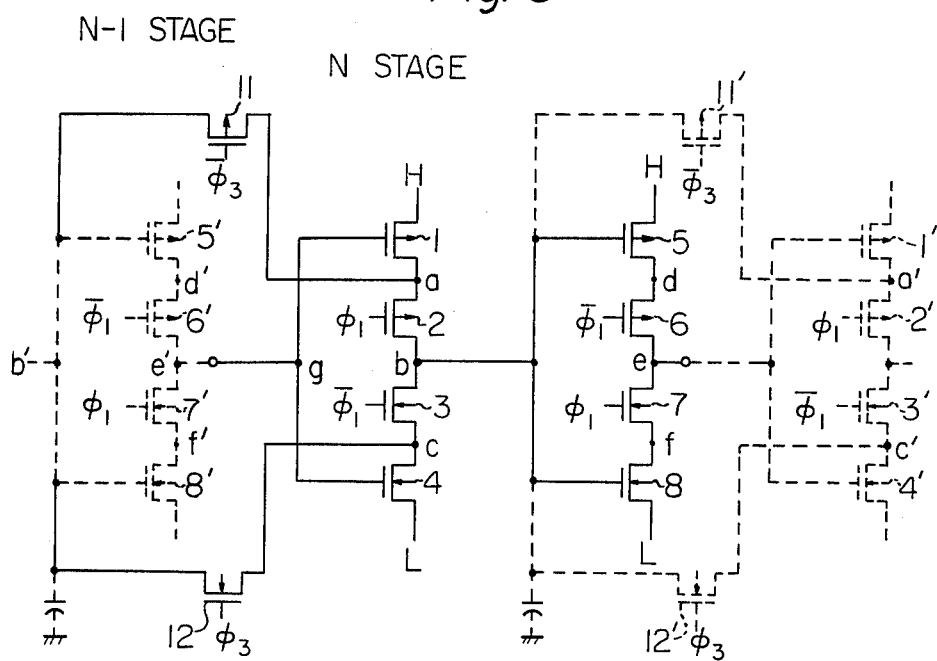
FIGS. 3 and 4 show the construction of semi-static shift registers in conformance with the invention.

FIG. 3 shows another embodiment of a shift register the construction of which will now be described. The drain electrode of P-MOST 1 having a source electrode tied to the high potential side (again abbreviated as H) of a power supply is connected to the source electrode of P-MOST 2 at a node a, the drain electrode of P-MOST 2 is connected to the drain electrode of N-MOST 3 at a node b, the source electrode of N-MOST 3 is connected to the drain electrode of N-MOST 4 at a node c, and the source electrode of N-MOST 4 is connected to the low potential side (again referred to as L) of the power source. This forms a master section. For a slave section, the source electrode of P-MOST 5 is tied to the H side of the power source while its drain electrode is connected to the source electrode of P-MOST 6 at a node d, the drain electrode of P-MOST 6 is connected to the drain electrode of N-MOST 7 at a node e, the source electrode of N-MOST 7 is connected to the drain electrode of N-MOST 8 at a node f, and the source electrode of N-MOST 8 is connected to the L side of the power source. The master section and slave section may be combined to form a 1-bit stage by tying the gate electrodes of P-MOST 1 and N-MOST 4 to a common data terminal g, applying a clock signal φ1 to the gate electrode of P-MOST 2 and a clock signal φ1 to the gate electrode of N-MOST 3, commonly tying the gate electrodes of P-MOST 5 and N-MOST 8 to a node b, and applying a clock signal φ1 to the gate electrode of P-MOST 6 and a clock signal φ1 to the gate electrode of N-MOST 7. This 1-bit stage is then connected to a plurality of similarly constructed cascades to construct the shift register.

With the exception of an initial stage, the node g of an Nth stage is connected to the node e' of an (N−1)th stage, and the node a of the Nth stage is connected through P-MOST 11 to the node b' of the (N-1)th master section. In a similar manner, the node c of the Nth stage master section, with the exception of an initial stage, is connected through N-MOST 12 to the node b' of the (N—1)th stage master section. In addition, a clock signal φ3 is applied to the gate electrode of P-MOST 11 and a clock signal φ3 is applied to the gate electrode of N-MOST 12, whereby an output signal is obtained at node e.

FIG. 8 shows clock signal waveforms for this embodiment of the invention. For the waveforms shown, the circuit depicted in FIG. 3 operates as follows. When clock signal φ1 is about to attain the state shown for the interval t4, P-MOST 11 and N-MOST 12 are both in the disenabled state. When clock signal φ1 does attain the state shown over the interval t4, node e' attains an H logic level. At this time the H level at node e' enables N-MOST 4 and the electric potential at the L side of the power source is transferred to node c. After node c attains an L logic level, N-MOST 12 is enabled and the potential at the L side of the power supply is transferred to node b'; thereby bringing this node to a static state during the interval t4.

When clock signal φ1 is about to assume the state shown over the interval t5, P-MOST 11 and N-MOST 12 are disenabled. When clock signal φ1 does attain the state shown over interval t5, P-MOST 6' and N-MOST 7' are disenabled and node e' attains a dynamic H level. The H level at node e' enables N-MOST 4, and P-MOST 2 and N-MOST 3 are enabled by clock signals φ1 and φ1, whereby node b attains a static level L. Since there is no static transfer to node e' during the interval t5, this interval is the period during which the dynamic memory effect at node e' is fully effective.

The clock signals next change to assume the states shown over the interval t6. P-MOSTs 6 and 6' and, 7 and 7' are thus enabled and node b attains a dynamic L level since P-MOST 2 and N-MOST 3 are disenabled. P-MOST 5 is enabled due to the L level at node b so that the potential on the H side of the power source is transferred to node e thereby inducing a static H level. This H level at node e enables N-MOST 4; and the potential on the L side of the power source is transferred to node b since N-MOST 12' is enabled by clock signal φ3 after node c' attains an L level. Node b which was in a dynamic state is thus caused to attain a static L level. Node b', in the same manner, attains a static level.

Figure 6:
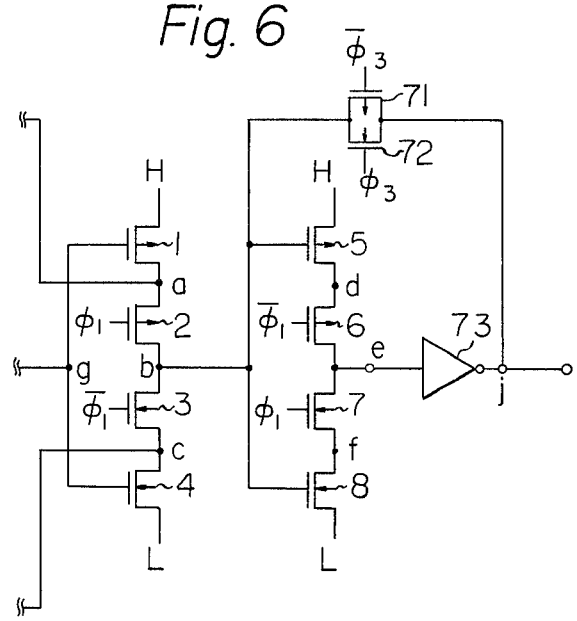
FIG. 6 shows the final stage circuitry for the semi-static shift register of FIG. 4.

FIG. 6 shows the circuitry involved when node e is the output terminal for the final stage. Here, node e is connected to the input terminal of a complementary MOST inverter 73 the output terminal j of which is commonly connected to the source electrode of P-MOST 71 and N-MOST 72. The respective drain electrodes of MOSTs 71 and 72 are commonly connected to node b of the final stage. When clock signal φ3 is applied to the gate terminal of P-MOST 71 and clock signal φ3 is applied to the gate terminal of N-MOST 72, node e of the last stage attains a static potential. This state is shown over interval t4 in FIG. 8. During this interval t4, the potential of node e is inverted by MOS inverter 73. After this inverted potential appears at a node j, MOSTs 71 and 72 are enabled, the potential at node j is transmitted to node b thereby to induce a static potential. Even if clock signal φ1 attains the level shown over the interval t5, node e, although in a dynamic state, will still remain at the same potential until the beginning of the interval t6 where it then attains a static state.

Figure 4:
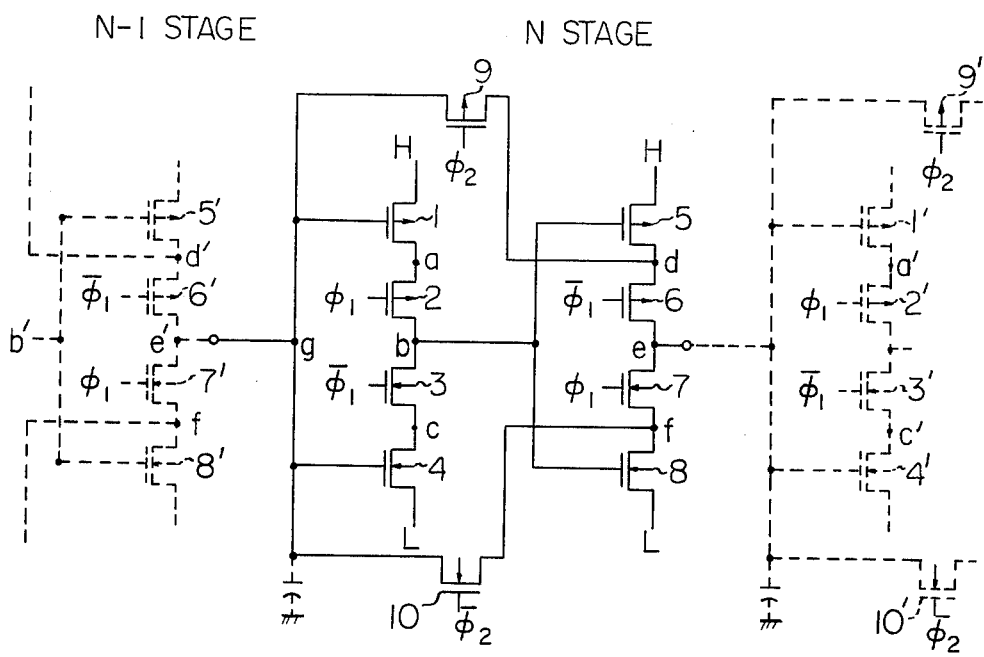

FIG. 4 shows another embodiment of a shift register the construction of which will now be described. The drain electrode of P-MOST 1 having a source electrode tied to the high potential side (abbreviated as H) of a power supply is connected to the source electrode of P-MOST 2 at a node a, the drain electrode of P-MOST 2 is connected to the drain electrode of N-MOST 3 at a node b, the source electrode of N-MOST 3 is connected to the drain electrode of N-MOST 4 at a node c, and the source electrode of N-MOST 4 is connected to the low potential side (referred to as L) of the power source. This forms the master section. For a slave section, the source electrode of P-MOST 5 is tied to the H side of the power source while its drain electrode is connected to the source electrode of P-MOST 6 at a node d, the drain electrode of P-MOST 6 is connected to the drain electrode of N-MOST 7 at a node e, the source electrode of N-MOST 7 is connected to the drain electrode of N-MOST 8 at a node f, and the source electrode of N-MOST 8 is connected to the L side of the power source. The master section and slave section may be combined to form a 1-bit stage by tying the gate electrodes if P-MOST 1 and P-MOST 4 to a common data terminal g, applying a clock signal φ1 to the gate electrode of P-MOST 2 and a clock signal φ1 to the gate electrode of P-MOST 3, commonly tying the gate electrodes of P-MOST 5 and N-MOST 8 to a node b, and applying a clock signal φ1 to the gate electrode of P-MOST 6 and a clock signal φ1 to the gate electrode of N-MOST 7. This 1-bit stage is then connected to a plurality of cascades to construct the shift register.

With the exception of the initial stage, the node g of the Nth stage is connected to the node e' of an (N-1)th stage, and the node d of the Nth stage is connected through P-MOST 9 to the node e' of the (N-1)th slave section. In a similar manner, the node f of the Nth stage slave section, with the exception of an initial stage, is connected through N-MOST 10 to the node e' of the (N-1)th slave section. In addition, a clock signal φ2 is applied to the gate electrode of P-MOST 9 and a clock signal φ2 is applied to the gate electrode of N-MOST 10, whereby an output signal is obtained at node e.

FIG. 9 shows clock signal waveforms for this embodiment of the invention. For the waveforms shown, the circuit depicted in FIG. 4 operates as follows. When clock signal φ1 is about to attain the state shown over the interval t7, P-MOST 9 and N-MOST 10 are disenabled, whereupon clock signal φ1 attains an H level shown over the interval t7 and clock signal φ1 attains an L logic level. Consequently, P-MOST 6' and N-MOST 7' are enabled whereby node e' attains a static potential level.

If for the sake of explanation node e' is assumed to be at an H level, this will cause N-MOST 4 to be enabled. However, since there is no circuit for a transfer to node b', the dynamic potential at node b' should be maintained during the time interval in which clock signal φ1 is changed to the state shown by interval t8. During this interval, clock signal φ1 attains an L logic level, clock signal φ1 attains an H logic level, N-MOST 3 is enabled, P-MOST 6' and N-MOST 7' are disenabled, and node e' attains a dynamic H potential which enables N-MOST 4 and node b attains a static L level. After this L level at node b enables P-MOST 5 and raises node d to an H level, P-MOST 9 is enabled, and an H level is transferred to node e' which thus attains a static H level.

When clock signal φ1 is about to change to the state shown over the interval t9, transfer from the nodes d and f to node e' is interrupted since P-MOST 9 and N-MOST 10 are disenabled. After this interruption of transmission, clock signal φ1 attains an H level, clock signal φ1 assumes an L level, P-MOST 2 and N-MOST 3 are disenabled, and node b attains a dynamic L level which enables P-MOST 5. Although node e attains a static H level, nodes b' and b are both in the dynamic state as described above. Consequently, clock signal φ1 is changed to the state shown during the interval t10 while node b still maintains its potential; accordingly, node e is brought to a state of static potential.

Figure 7:
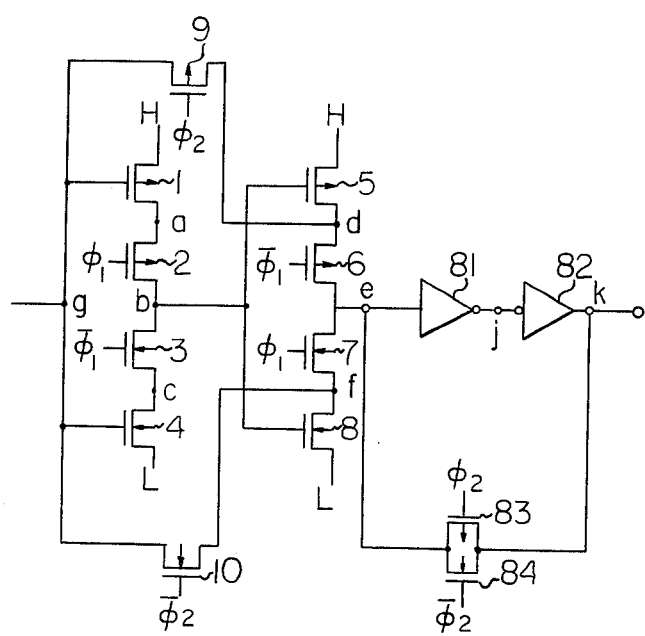
FIG. 7 shows the final stage circuitry for the semi-static shift register of FIG. 4.

FIG. 7 shows the circuitry involved when node e is the output terminal for the final stage and it is connected to the input terminal of a complementary MOST inverter 81 the output terminal j of which is connected to the input terminal of a complementary MOST inverter 82. The output terminal k of inverter 82 is commonly connected to the respective source electrodes of P-MOST 83 and N-MOST 84, the drain electrodes of MOSTs 83 and 84 are connected to node e, a clock signal φ2 is supplied to the gate electrode of P-MOST 83, and a clock signal φ2 is supplied to the gate electrode of N-MOST 84. With node e in the dynamic state, MOSTs 83 and 84 are enabled once clock signals φ1 and φ1 have attained respective L and H logic levels; accordingly, the static potential at node k is transferred to node e whereby the final stage output potential is changed to a static potential.

As is apparent from the foregoing explanation, the shift register of the present invention has a reduced number of components but is still capable of delivering highly effective performance.

What is claimed is:

1. A shift register comprising:
a master section in which the drain electrode of a first P-channel MOS transistor having a source electrode connected to the high potential side of a power source is connected to the source electrode of a second P-channel MOS transistor at a first node, the drain electrode of said second P-channel MOS transistor is connected to the drain electrode of a first N-channel MOS transistor at a second node, the source electrode of said first N-channel MOS transistor is connected to the drain electrode of a second N-channel MOS transistor at a third node, and the source electrode of said second N-channel MOS transistor is connected to the low potential side of the power source; and a slave section in which the drain electrode of a third P-channel MOS transistor having a source electrode connected to the high potential side of the power source is connected to the source electrode of a fourth P-channel MOS transistor at a fourth node, the drain electrode of said fourth P-channel MOS transistor is connected to the drain electrode of a third N-channel MOS transistor at a fifth node, the source electrode of said third N-channel MOS transistor is connected to the drain electrode of a fourth N-channel MOS transistor at a sixth node, and the source electrode of said fourth N-channel MOS transistor is connected to the low potential side of the power source;

wherein the respective gate electrodes of said first P-channel MOS transistor and said second N-channel MOS transistor are connected to each other at a seventh node, first and second clock pulses are applied to the respective gate electrodes of said second P-channel and first N-channel MOS transistors, the respective gate electrodes of said third P-channel MOS transistor and fourth N-channel MOS transistor are tied together and connected to said second node of the master section, and the second and first clock pulses are applied to respective gate electrodes of said fourth P-channel MOS transistor and third N-channel MOS transistor;

whereby the master section and slave section form a 1-bit stage which is thereafter connected to a plurality of similarly constructed cascades;

said first and third nodes of the master section, with the exception of the initial stage, being connected to a second node of the master section of the preceding stage through a fifth P-channel MOS transistor and fifth N-channel MOS transistor, respectively, with third and fourth clock pulses being applied to respective fifth P-channel MOS transistor and fifth N-channel MOS transistor thereby to produce an output at said fifth node.

2. A shift register according to claim 1, wherein the output of the final stage is connected to a first MOS inverter the output of which is connected to said second node through a first transmission gate composed of MOS transistors of opposite polarity.

3. A shift register comprising:

a master section in which the drain electrode of a first P-channel MOS transistor having a source electrode connected to the high potential side of a power source is connected to the source electrode of a second P-channel MOS transistor at a first node, the drain electrode of said second P-channel MOS transistor is connected to the drain electrode of a first N-channel MOS transistor at a second node, the source electrode of said first N-channel MOS transistor is connected to the drain electrode of a second N-channel MOS transistor at a third node, and the source electrode of said second N-channel MOS transistor is connected to the low potential side of the power source; and a slave section in which the drain electrode of a third P-channel MOS transistor having a source electrode connected to the high potential side of the power source is connected to the source electrode of a fourth P-channel MOS transistor at a fourth node, the drain electrode of said fourth P-channel MOS transistor is connected to the drain electrode of a third N-channel MOS transistor at a fifth node, the source electrode of said third N-channel MOS transistor is connected to the drain electrode of a fourth N-channel MOS transistor at a sixth node, and the source electrode of said fourth N-channel MOS transistor is connected to the low potential side of the power source;

wherein the respective gate electrodes of said first P-channel MOS transistor and said second N-channel MOS transistor are connected to each other at a seventh node, first and second clock pulses are applied to the respective gate electrodes of said second P-channel and first N-channel MOS transistors, the respective gate electrodes of said third P-channel MOS transistor and fourth N-channel MOS transistor are tied together and connected to said second node of the master section, and the second and first clock pulses are applied to respective gate electrodes of said fourth P-channel MOS transistor and third N-channel MOS transistor;

whereby the master section and slave section form a 1-bit stage which is thereafter connected to a plurality of similarly constructed cascades;

said fourth and sixth nodes of the slave section, with the exception of the initial stage, being connected respectively through fifth P-channel MOS transistor and fifth N-channel MOS transistor to said seventh node and hence to an output of the slave section of the preceding stage, with third and fourth clock pulses being applied to respective fifth P-channel and N-channel transistors thereby to produce an output at said fifth node.

4. A shift register according to claim 3, wherein the output of the final stage is series connected to first and second MOS inverters which produce an output signal connected back to the final stage output terminal through a first transmission gate composed of MOS transistors of opposite polarity.

5. A shift register comprising:

a master section in which the drain electrode of a first P-channel MOS transistor having a source electrode connected to the high potential side of a power source is connected to the source electrode of a second P-channel MOS transistor at a first node, the drain electrode of said second P-channel MOS transistor is connected to the drain electrode of a first N-channel MOS transistor at a second node, the source electrode of said first N-channel MOS transistor is connected to the drain electrode of a second N-channel MOS transistor at a third node, and the source electrode of said second N-channel MOS transistor is connected to the low potential side of the power source; and a slave section in which the drain electrode of a third P-channel MOS transistor having a source electrode connected to the high potential side of the power source is connected to the source electrode of a fourth P-channel MOS transistor at a fourth node, the drain electrode of said fourth P-channel MOS transistor is connected to the drain electrode of a third N-channel MOS transistor at a fifth node, the source electrode of said third N-channel MOS transistor is connected to the drain electrode of a fourth N-channel MOS transistor at a sixth node, and the source electrode of said fourth N-channel MOS transistor is connected to the low potential side of the power source;

wherein the respective gate electrodes of said first P-channel MOS transistor and said second N-channel MOS transistor are connected to each other at a seventh node, first and second clock pulses are applied to the respective gate electrodes of said second P-channel and first N-channel MOS transistors, the respective gate electrodes of said third P-channel MOS transistor and fourth N-channel MOS transistor are tied together and connected to said second node of the master section, and the second and first clock pulses are applied to respective gate electrodes of said fourth P-channel MOS transistor and third N-channel MOS transistor;

whereby the master section and slave section form a 1-bit stage which is thereafter connected to a plurality of similarly constructed cascades;

said fifth node of the final stage being connected to a first MOS inverter which is in turn connected to a second MOS inverter, the common connection of said inverters being connected to said second node through a first transmission gate composed of MOS transistors of opposite polarity, and the output of said second MOS inverter and input of said first MOS inverter being connected together through a second transmission gate composed of MOS transistors of opposite polarity.

* * * * *